United States Patent
Mergener

(10) Patent No.: US 9,623,545 B2
(45) Date of Patent: Apr. 18, 2017

(54) APPARATUS WITH ACTIVE SOFTWARE CLAMPING OF SUPPLY VOLTAGE

(71) Applicant: Milwaukee Electric Tool Corporation, Brookfield, WI (US)

(72) Inventor: Matthew J. Mergener, Germantown, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 92 days.

(21) Appl. No.: 14/176,812

(22) Filed: Feb. 10, 2014

(65) Prior Publication Data

US 2014/0225544 A1 Aug. 14, 2014

Related U.S. Application Data

(60) Provisional application No. 61/762,739, filed on Feb. 8, 2013.

(51) Int. Cl.

| | |
|---|---|
| *H02H 7/09* | (2006.01) |
| *B25D 17/00* | (2006.01) |
| *B25F 5/00* | (2006.01) |
| *H02P 29/024* | (2016.01) |
| *H02H 7/08* | (2006.01) |
| *H02P 6/16* | (2016.01) |
| *H02P 6/14* | (2016.01) |

(52) U.S. Cl.
CPC ............... *B25D 17/00* (2013.01); *B25F 5/00* (2013.01); *H02P 29/0241* (2016.02); *B25D 2250/091* (2013.01); *B25D 2250/221* (2013.01); *H02H 7/0833* (2013.01); *H02P 6/14* (2013.01); *H02P 6/16* (2013.01)

(58) Field of Classification Search
CPC .... H02P 6/002; H02P 6/14; H02P 6/16; H02P 29/02; H02H 7/0833
USPC ....................... 318/400.22; 388/937
See application file for complete search history.

(56) References Cited

U.S. PATENT DOCUMENTS

| | | | | |
|---|---|---|---|---|
| 2006/0220605 | A1* | 10/2006 | Funabashi | H01M 2/1022 318/434 |
| 2008/0054832 | A1* | 3/2008 | Mueller | H02P 1/166 318/434 |
| 2008/0059089 | A1* | 3/2008 | Hornick | H02J 7/0063 702/63 |

(Continued)

*Primary Examiner* — Kawing Chan
*Assistant Examiner* — Bradley Brown
(74) *Attorney, Agent, or Firm* — Michael Best & Friedrich LLP

(57) ABSTRACT

A power tool that includes a motor configured to drive a working element, a power supply that is coupled to the motor to provide power to the motor, a shunt circuit that is coupled to the power supply and the motor, and a controller. The shunt circuit includes a shunt switch and a shunt element and is configured to hold a voltage of the power supply below a high voltage threshold. The shunt switch is switchable between a conducting state, in which the shunt switch conducts current through the shunt element, and a non-conducting state, in which the shunt switch does not conduct current through the shunt element. The controller is coupled to the motor, the power supply, and the shunt circuit and is configured to determine the voltage of the power supply, and control the shunt switch based on the voltage from the power supply.

20 Claims, 6 Drawing Sheets

(56) References Cited

U.S. PATENT DOCUMENTS

2011/0304287 A1\* 12/2011 Yang et al. .................. 318/139
2012/0024552 A1\* 2/2012 Kawano et al. .................. 173/2

\* cited by examiner

APPARATUS WITH ACTIVE SOFTWARE CLAMPING OF SUPPLY VOLTAGE

CROSS-REFERENCE TO RELATED APPLICATIONS

The application claims priority to U.S. Provisional Patent Application No. 61/762,739, filed Feb. 8, 2013, the entire contents of which are incorporated herein by reference.

FIELD OF INVENTION

The invention relates to an apparatus, such as a power tool, having a voltage clamp for a supply voltage associated with the apparatus.

SUMMARY

Embodiments of the invention provide protection of supply voltage from power supplies on BLDC power tools using a software loop and circuit. Exemplary power tools having the protection circuit include circular saws, high torque impact wrenches, and reciprocating saws. The invention can be extended to other apparatuses that require a voltage clamp for the supply voltage.

In one embodiment, the invention provides a power tool including a motor. The motor is configured to drive a working element. The power tool also includes a power supply that is coupled to the motor to provide power to the motor. The power tool further includes a shunt circuit that is coupled to the power supply and the motor. The shunt circuit is configured to hold a voltage of the power supply below a high voltage threshold. The shunt circuit includes a shunt switch and a shunt element. The shunt switch is switchable between a conducting state, in which the shunt switch conducts current through the shunt element, and a non-conducting state, in which the shunt switch does not conduct current through the shunt element. The power tool also includes a controller that is coupled to the motor, the power supply, and the shunt circuit. The controller is configured to determine the voltage of the power supply, and control the shunt switch based on the voltage from the power supply.

In another embodiment, the invention provides a method of regulating a supply voltage of a power tool. The method includes determining, by a controller, that the supply voltage of the power tool exceeds a regulating threshold and regulating, by a shunt switch and a shunt element, the supply voltage of the power tool to prevent the supply voltage from exceeding a high voltage threshold. Regulating the supply voltage of the power tool includes placing, by the controller, a shunt switch in a conducting state in response to the determination; dissipating energy, by a shunt element, when the shunt switch is in the conducting state; placing, by the controller, the shunt switch in a non-conducting state in response to the determination; and disconnecting, by the shunt switch, the shunt element thereby preventing the shunt element from dissipating, at least some, of the energy from the supply voltage.

In yet another embodiment, the invention provides a power tool including a motor configured to drive a working element. The power tool also includes a power supply coupled to the motor to provide power to the motor. The power tool also includes a shunt circuit coupled to the power supply and the motor. The shunt circuit is coupled in parallel to the motor and the shunt circuit includes a shunt switch and a shunt element. The power tool further includes a voltage sensor coupled to the power supply and connected in parallel to the motor and the shunt circuit. The power tool also includes a controller coupled to the voltage sensor and to the shunt circuit. The controller is configured to receive a signal representative of the supply voltage from the voltage divider network, determine if the voltage from the power supply exceeds a regulating threshold, and output a control signal to the shunt circuit based on if the signal representative of the supply voltage exceeds the regulating threshold.

One embodiment of the invention includes a voltage regulator of a power tool including a battery supply line, a resistor divider coupled to the voltage supply line, and an analog-to-digital converter (ADC) coupled to the resistor divider circuit and outputting a signal representing a voltage level of the battery supply line. The regulator further includes a microcontroller executing a software control loop and a shunt circuit. The software control loop receives the signal output by the ADC and compares the signal to a voltage threshold. The shunt circuit includes a shunt resistor coupled to a shunt transistor and the battery supply line. The shunt transistor is selectively enabled by the microcontroller when the signal exceeds the voltage threshold to shunt current from the battery supply line through the shunt resistor, and is disabled when the signal is less than the voltage threshold.

One embodiment of the invention includes a voltage regulator of a power tool including a battery supply line, an analog-to-digital converter (ADC) outputting a signal representing a voltage level of the battery supply line, and a microcontroller executing a software control loop. The software control loop receives the signal output by the ADC and compares the signal to a voltage threshold. The voltage regulator further includes a shunt circuit. The shunt circuit includes a shunt resistor coupled to a shunt transistor and the battery supply line. The shunt transistor is selectively enabled by the microcontroller to shunt current based on the comparison of the signal output by the ADC and the voltage threshold.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
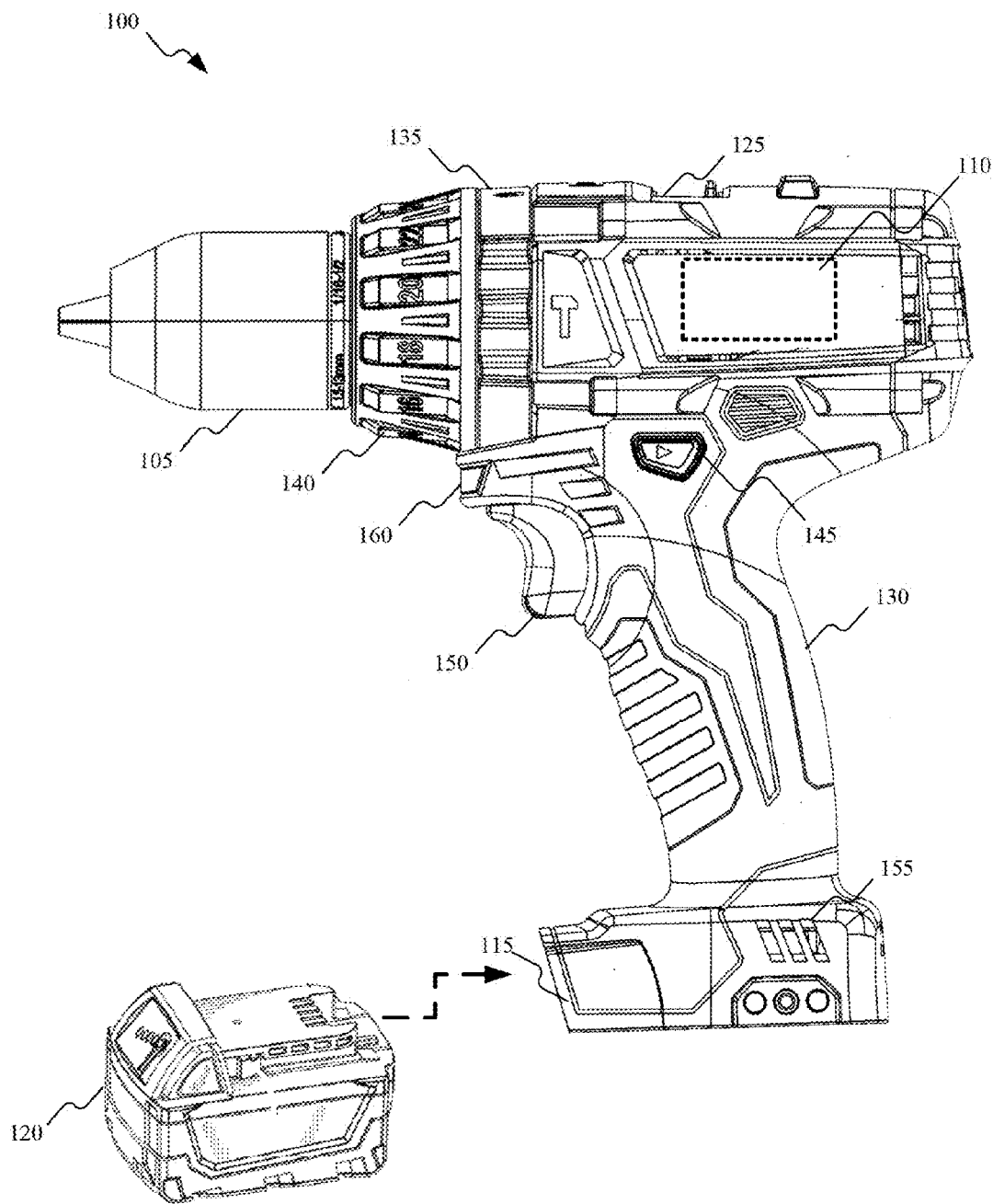
FIG. 1 illustrates a handheld power tool incorporating an embodiment of the invention.

FIG. 1 illustrates a power tool 100. The power tool 100 can be any handheld power tool, for example, a hammer drill/driver, an impact driver, an impact wrench, reciprocating saw, and the like. The illustrated handheld power tool 100 is a hammer drill/driver (herein referred to simply as "the hammer drill"). The hammer drill 100 includes an output drive device or working element (e.g., a chuck) 105, a brushless direct current ("BLDC") motor 110, and a battery pack receiving portion 115 that receives a battery pack 120 and includes a terminal assembly including a plurality of terminals. The BLDC motor 110 is coupled to the battery pack receiving portion 115 such that the BLDC motor 110 is configured to receive power from the battery pack 120 coupled to the battery receiving portion 115. The BLDC motor 110 is also coupled to the working element 105 to drive the working element 105. The number of terminals present in the battery pack receiving portion 115 can vary based on the type of hand-held power tool 100 and/or the type of battery pack 120 associated with the hammer drill 100. However, as an illustrative example, the battery pack receiving portion 115 and the terminal assembly can include a battery positive ("B+") terminal, a battery negative ("B−") terminal, a sense or communication terminal, an identification terminal, and the like. In the illustrated embodiment, the working element 105 includes a chuck, but in other embodiments, the working element 105 may include other elements such as, a blade. The hammer drill 100 also includes an upper main body 125, a handle portion 130, a mode selection portion 135, a torque adjustment dial or ring 140, a forward/reverse selection button 145, a trigger 150, and air vents 155. As shown in FIG. 1, the hammer drill 100 also includes a worklight 160.

The outer portions of the hammer drill 100 (e.g., the main body 125 and the handle portion 130) are composed of a durable and light-weight plastic material. The working element 105 is composed of a metal (e.g., steel) as is known in the art. In the illustrated embodiment, the mode selection portion 135 includes a rotary dial that allows a user to select between a drilling mode, a driving mode, a hammer mode, and the like. In other embodiments, the mode selection portion 135 may include a button or a series of buttons. In yet other embodiments, the mode selection portion 135 may include a switch movable between two or more positions that thereby selects an operating mode of the hammer drill 100. The mode selection portion 135 may additionally or alternatively include other types of actuators not specifically mentioned herein. In other embodiments, the hammer drill 100 may include more or less modes than the ones listed above. The torque adjustment ring 140 allows a user to select a specific amount of torque for a given application. For example, when tightening screws on a softer material, a lower amount of torque may be preferred, but a higher amount of torque may be desired when tightening screws on a harder material. The forward/reverse selection button 145 determines the rotating direction of the working element 105. The trigger 150 activates the hammer drill 100 to operate at the specified settings (e.g., according to the position of the torque adjustment dial 140 and the mode selection portion 135). The trigger 150 may be associated with a trigger switch 165 (see FIG. 2). The trigger 150 may change the position of the trigger switch 165, which may be connected to other electrical components of the hammer drill 100, to control the operation of the hammer drill 100. The air vents 155 allow heat generated by the BLDC motor 110, the battery pack 120, and other electrical and mechanical components of the hammer drill 100 to be, at least partly, removed.

Figure 2:
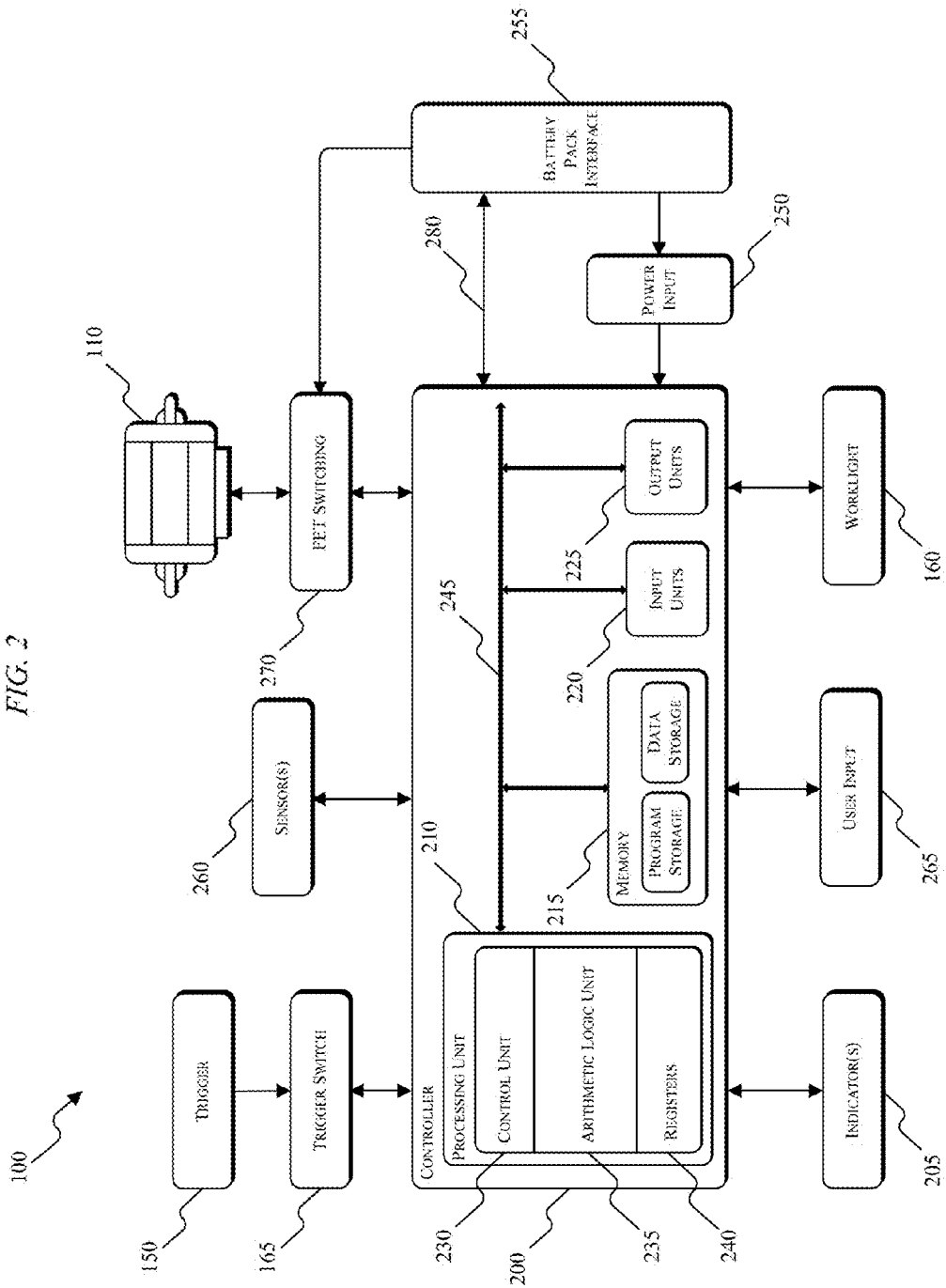
FIG. 2 illustrates electronic circuitry for the handheld power tool of FIG. 1.

As illustrated in FIG. 2, the hammer drill 100 also includes a controller 200. The controller 200 is electrically and/or communicatively connected to a variety of modules or components of the hammer drill 100. The controller 200 includes combinations of hardware and software that are operable to, among other things, control the operation of the hammer drill 100, activate the one or more indicators 205, monitor the operation of the hammer drill 100, and the like. In the illustrated embodiment, the controller 200 includes a plurality of electrical and electronic components that provide power, operational control, and protection to the components and modules within the controller 200 and/or hammer drill 100. For example, the controller 200 includes, among other things, a processing unit 210 (e.g., a microprocessor, a microcontroller, or another suitable programmable device), a memory 215, input units 220, and output units 225. The processing unit 210 includes, among other things, a control unit 230, an arithmetic logic unit ("ALU") 235, and a plurality of registers 240 (shown as a group of registers in FIG. 2), and is implemented using a known computer architecture, such as a modified Harvard architecture, a von Neumann architecture, or the like. The processing unit 210, the memory 215, the input units 220, and the output units 225, as well as the various modules connected to the controller 200 are connected by one or more control and/or data buses (e.g., common bus 245). The control and/or data buses are shown generally in FIG. 2 for illustrative purposes.

The memory 215 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 210 is connected to the memory 215 and executes software instructions that are capable of being stored in a RAM of the memory 215 (e.g., during execution), a ROM of the memory 215 (e.g., on a generally permanent basis), or another non-transitory computer readable medium such as another memory or a disc. Software included in the implementation of the hammer drill 100 can be stored in the memory 215 of the controller 200. The software includes, for example, firmware, one or more applications, program data, filters, rules, one or more program modules, a software control loop as discussed below used for supply voltage regulation, and other executable instructions. The controller 200 is configured to retrieve from memory and execute, among other things, instructions related to the control processes and methods described herein. In other constructions, the controller 200 includes additional, fewer, or different components.

The controller 200 is connected to one or more indicators 205 (e.g., an LED), a power input module 250, a battery pack interface 255, one or more sensors 260, the worklight 160, a user input module 265, the trigger switch 165 (connected to trigger 150), and a FET switching module 270. The one or more sensors 260 include, among other things, one or more temperature sensors, one or more Hall Effect sensors, etc. For example, the speed of the BLDC motor 110 can be determined using a plurality of Hall Effect sensors to sense the rotational position of the rotor. As such, the controller 200 calculates or includes, within memory, predetermined operational threshold values and limits for operation. In some embodiments, the threshold values are dynamically adjusted based on operational characteristics of, for example, the battery pack 120, the motor 110, or control electronics (e.g., the voltage regulating circuit 170). For example, if the temperature of the battery pack 120 is increasing rapidly or is nearing a maximum temperature limit, the battery pack 120 can communicate with the hammer drill 100 and the operational limits of the hammer drill 100 or battery pack 120 can be modified (e.g., increased or decreased). In some embodiments, when a potential thermal failure (e.g., of a FET, the battery pack 120, or the motor 110) is detected or predicted by the controller 200, power to the motor 110 can be limited interrupted until the potential for thermal failure is reduced. Additionally or alternatively, the hammer drill 100 can communicate with the battery pack 120 to indicate when the hammer drill 100 is capable of receiving higher input currents.

The battery pack interface 255 includes a combination of mechanical and electrical components configured to and operable for interfacing (e.g., mechanically, electrically, and communicatively connecting) a hand-held power tool with a battery pack (e.g., battery pack 120). For example, power provided by the battery pack 120 to the hammer drill 100, is provided through the battery pack interface 255 to the power input module 250. The power input module 250 includes combinations of active and passive components to regulate or control the power received from the battery pack 120 prior to power being provided to the controller 200. The battery pack interface 255 also supplies power to the FET switching module 270 to be switched by the switching FETs to selectively provide power to the motor 110. The battery pack interface 255 also includes, for example, a communication line 280 for provided a communication line or link between the controller 200 and the battery pack 120. For example, the communication can include serial communication or a serial communication link, the transmission or conveyance of information from one of the battery pack 120 or the hammer drill 100 to the other of the battery pack 120 or hammer drill 100 related to a condition or characteristic of the battery pack 120 or hammer drill 100 (e.g., one or more battery cell voltages, one or more battery pack voltages, one or more battery cell temperatures, one or more battery pack temperatures, etc.).

In some embodiments, the trigger switch 165 is combined and integral with the controller 200 within a housing of the hammer drill 100. The trigger switch 165 is connected to the trigger 150 for controlling the power provided to the motor 110 through the switching FET module 270. In some embodiments, the amount of trigger pull detected by the trigger switch 165 is related to or corresponds to a desired speed of rotation of the motor 110. In other embodiments, the amount of trigger pull detected by the trigger switch 165 is related to or corresponds to a desired torque.

The worklight 160 is controlled by the controller 200. In some embodiments, the worklight 160 is illuminated when the trigger 150 is pulled. In other embodiments, a dedicated switch or button is provided on the hammer drill 100 or battery pack 120 for activating the worklight 160 without pulling the trigger 150. The worklight 160 can remain illuminated for a duration corresponding to an amount of time that the trigger 150 is pulled. Additionally or alternatively, the worklight 160 is activated when the trigger 150 is pulled and remains illuminated for a predetermined period of time (e.g., 2 seconds, 10 seconds, between 2 and 60 seconds, etc.) after the trigger 150 is pulled, or the worklight 160 is activated when the trigger 150 is pulled and remains activated for a predetermined period of time (e.g., 2 seconds, 10 seconds, between 2 and 60 seconds, etc.) after the trigger 150 has been released.

The user input module 265 is operably coupled to the controller 200 to, for example, select a forward or a reverse mode of operation, a torque and/or speed setting for the hammer drill 100 (e.g., using the torque adjustment dial 140 and/or mode selecting portion 135), and the like. In some embodiments, the user input module 265 includes a combination of digital and analog input or output devices required to achieve a desired level of operation for the hammer drill 100, such as one or more knobs, one or more dials, one or more switches, one or more buttons, etc.

The indicators 205 include, for example, one or more light-emitting diodes ("LED"). The indicators 205 can be configured to display conditions of, or information associated with, the hammer drill 100. For example, the indicators 205 are configured to indicate measured electrical characteristics of the hammer drill 100, the status of the hammer drill 100, and the like.

The power input module 250 includes a voltage regulating circuit 300. The voltage regulating circuit 300 maintains the voltage supplied by the battery pack 120 to the motor 110 within a specified range. In other words, the voltage regulating circuit 300 maintains the supply voltage (i.e., the voltage supplied by the battery pack 120 to the motor 110) above a low voltage threshold and below a high voltage threshold, such that internal electrical components of the hammer drill 100 are not compromised due to high or low voltage conditions. For example, a typical common supply voltage (often referred to as "VCC") designated in a battery-powered power tool is 22 VDC. The voltage regulating circuit 300 maintains the supply voltage (VCC) between 21 VDC and 23 VDC. Based on the specific power tool 100 and the application of the voltage regulating circuit 300, the low voltage threshold and the high voltage threshold may be different than the thresholds discussed above. One challenge for a power tool is to keep the supply voltage below the high voltage threshold (e.g., 23 VDC), but above the low voltage threshold (e.g., 21 VDC) so as not to bleed any battery energy when below the low voltage threshold. The voltage regulating circuit 300 is disabled when the supply voltage is below the low voltage threshold, preventing bleeding of the battery pack 120 and is enabled to maintain the supply voltage below the high voltage threshold as described below.

Figure 3A:
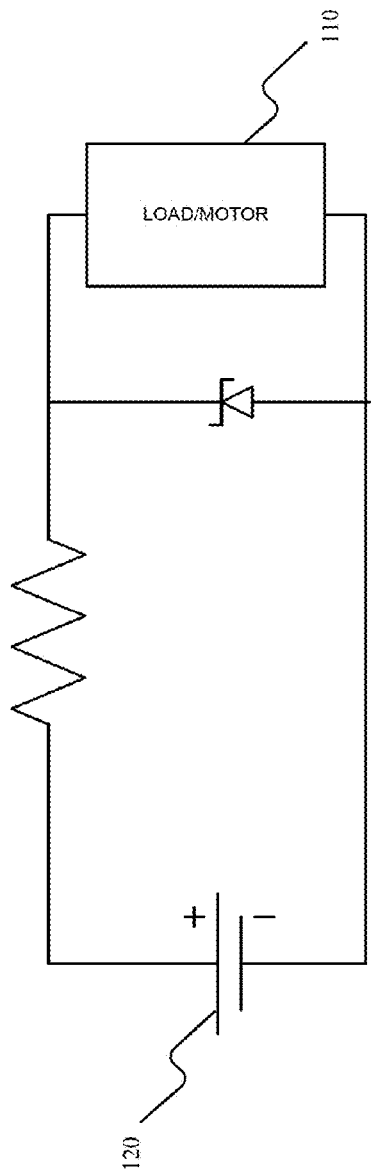
FIG. 3A illustrates a prior art voltage regulating circuit.

As shown in FIG. 3A, prior art voltage regulating circuits include a zener diode connected in parallel to a load (e.g., the motor 110). However, due to the manufacturing of conventional medium power zener diodes, voltage regulating circuits of the prior art, such as the one shown in FIG. 3A, often have a tolerance percentage of more than five percent. In other words, a voltage regulating circuit of the prior art that includes a zener diode cannot regulate the supply voltage tightly enough in some power tools due simply to component tolerance. For example, if a zener diode with a breakdown voltage of 22V is used, in order for the prior art regulating circuit to maintain the supply voltage within the desired range, the zener diode is expected to behave ideally and not conduct any current when the supply voltage is below the low voltage threshold, and behave like an ideal conductor when the supply voltage is above the low voltage threshold. Low cost zener diodes have a gradual transition (from not conducting current to conducting current), which means that they leak a small amount of current even when the supply voltage is below the low voltage threshold, and are not ideal conductors when the supply voltage is above the low voltage threshold. For example, with a single zener diode having a higher power rating of 3 W, the tolerance range is about 21 to 23V, which does not consider design tolerances for other components. Thus, a more precise voltage regulating circuit may be desired, if not necessary, for some applications in which the voltage supplied from the battery pack 120 is more closely regulated. Additionally, the operation of the motor 110 may cause high voltage transients on the order of, for example, 40-50 V. The high voltage transients should be reduced by voltage regulating circuits because many electronic components cannot receive such high voltages.

Figure 3B:
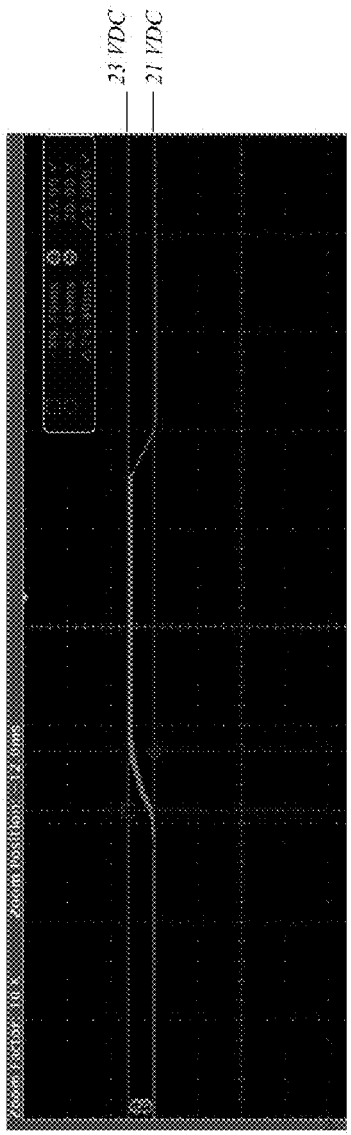
FIG. 3B illustrates a graph of voltage over time for the prior art voltage regulating circuit of FIG. 3A.

FIG. 3B illustrates a voltage vs. time graph of the supply voltage (e.g., 22 VDC nominal) using a prior art voltage regulating circuit. As shown in FIG. 3B, the zener diode voltage regulating circuit maintains the supply voltage at a high voltage threshold of 23 VDC. While the zener diode may be theoretically sufficient for some applications, a battery clamping tolerance is necessary for other applications.

Figure 4:
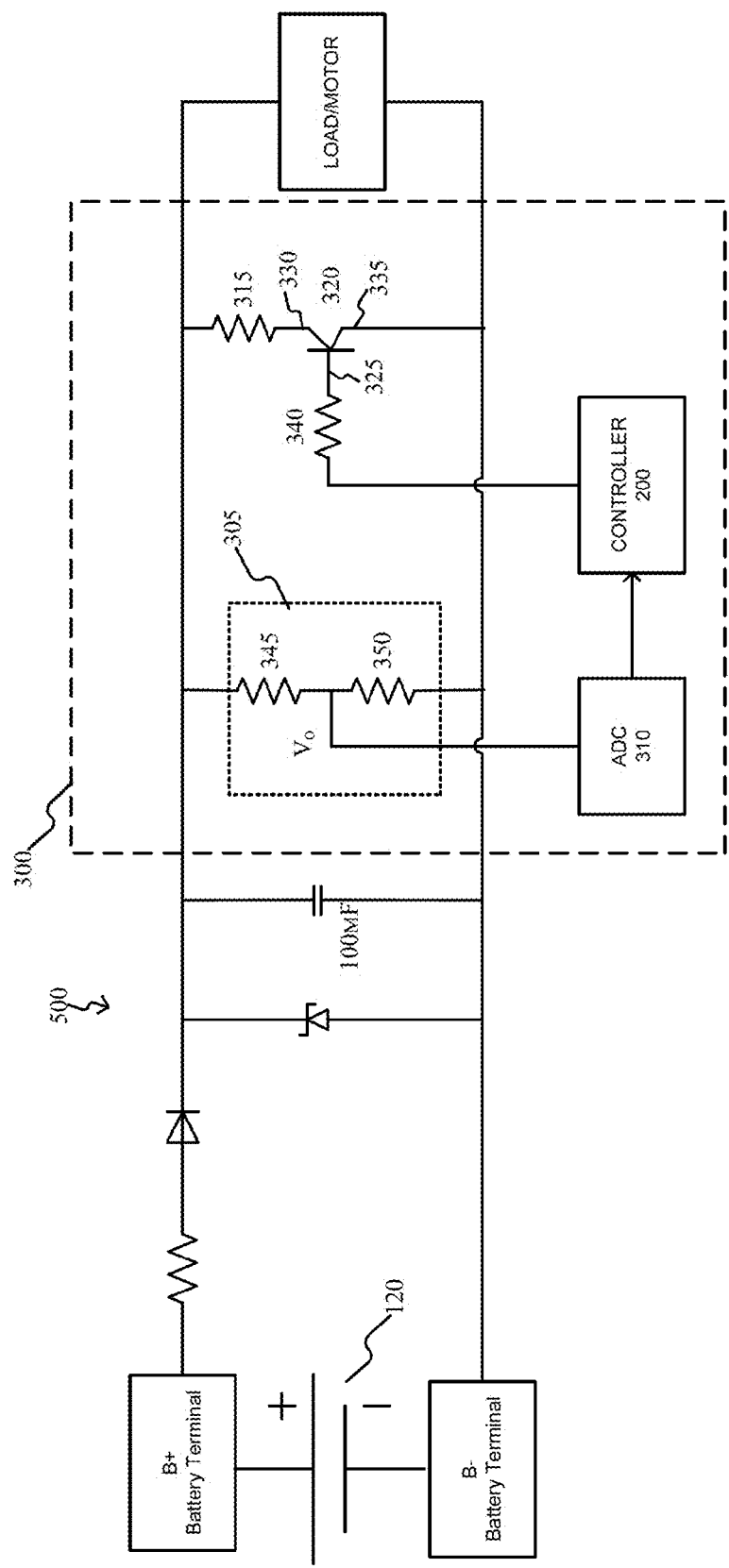
FIG. 4 illustrates a voltage regulating circuit according to an embodiment of the invention.

Accordingly, as shown in FIG. 4, the voltage regulating circuit 300 dissipates energy when the supply voltage meets a first condition and does not dissipate energy when the supply voltage does not meet the first condition. For example, in the illustrated embodiment, the voltage regulating circuit 300 dissipates energy from the battery pack 120 when the supply voltage exceeds a predetermined regulating threshold and does not dissipate energy when the supply voltage does not exceed the predetermined regulating threshold. In the illustrated embodiment, the predetermined regulating threshold corresponds to the low voltage threshold associated with the specific range in which the supply voltage is maintained. In other embodiments, the predetermined regulating threshold corresponds to a voltage slightly above the low voltage threshold. By setting the regulating threshold at or near the low voltage threshold, the voltage regulating circuit 300 prevents the supply voltage from reaching the high voltage threshold and also prevents draining the battery pack 120 too quickly.

In the illustrated embodiment, a zener diode regulating circuit 500 is included in conjunction with the voltage regulating circuit 300. The zener diode regulating circuit 500 may be used as a backup voltage regulating circuit, in particular if the voltage regulating circuit 300 fails. In other embodiments, the zener diode regulating circuit 500 may be removed.

In general, the controller 200 receives a signal that is representative of the supply voltage. If the BLDC motor 110 is coupled to the battery pack 120 to receive power from the battery pack 120 (e.g., if the BLDC motor 110 is in operation), the controller 200 then determines if the signal representative of the supply voltage meets the first condition. If the BLDC motor 110 is not coupled to the battery pack 120 (e.g., if the BLDC motor 110 is not in operation), no further analysis of the supply voltage is performed because the supply voltage is not provided to the BLDC motor 110. As explained above, the controller 200 enables the voltage regulating circuit 300 to dissipate energy from the battery pack 120 when the digital signal representative of supply voltage meets the first condition and the BLDC motor 110 receives power from the battery pack 120.

As illustrated in FIG. 4, the voltage regulating circuit 300 includes a shunt circuit and a voltage sensor 302. In some embodiments, the shunt circuit is connected directly in parallel to the motor 110. In other embodiments, an analog voltage regulator may be connected between the voltage regulating circuit 300 and the motor 110. In such embodiments, the analog voltage regulator receives the output voltage from the voltage regulating circuit 300. Nevertheless, the shunt circuit is connected in parallel to the motor 110. The shunt circuit includes a shunt resistor 315, and a shunt bipolar NPN transistor 320. The bipolar transistor 320 includes a base terminal 325, a collector terminal 330, and an emitter terminal 335. The base terminal 325 of the bipolar transistor 320 is connected to the controller 200 through a general purpose input/output (GPIO) pin of the controller 200. In other embodiments, the base terminal 325 is connected to the controller 200 through a different pin of the controller 200. The collector terminal 330 of the bipolar transistor 320 is connected to the shunt resistor 315. The emitter terminal 335 of the bipolar transistor 320 is connected to the negative battery terminal (B−) (e.g., a reference potential). In other embodiments, the emitter terminal 335 of the bipolar transistor 320 is connected to the shunt resistor 315 and the collector terminal is connected to the positive battery terminal (B+). In the illustrated embodiment, the base terminal 325 of the bipolar transistor 320 is connected to a base resistor 340 that is in turn connected to the controller 200 through the general purpose input/output pin. In other embodiments, the base terminal 325 of the bipolar transistor 320 is connected directly to the controller 200.

The bipolar transistor 320 is switchable between a conducting state and a non-conducting state. When the bipolar transistor 320 is in the conducting state, the shunt resistor 315 is connected between the positive battery terminal (B+) and the negative battery terminal (B−). Thus, when the bipolar transistor 320 is in the conducting state, the shunt resistor 315 dissipates a portion of the energy supplied by the battery pack 120. When the bipolar transistor 320 is in the non-conducting state, the shunt resistor 315 is disconnected from one of the positive battery terminal (B+) and the negative battery terminal (B−). Thus, when the bipolar transistor 320 is in the conducting state, the shunt resistor 315 does not dissipate energy supplied by the battery pack 120. The shunt circuit dissipates energy with a resistor (e.g., the shunt resistor 315) instead of with an active semiconductor junction (e.g., zener diode). The voltage regulating circuit 300 is able to dissipate the high transient voltages (e.g., 40-50 V) to protect the circuit components of the hammer drill 100. In other embodiments, other types of electronic switches may be used (e.g., MOSFETs) in addition to or instead of the bipolar transistor 320.

In the illustrated embodiment, the voltage sensor 302 includes a voltage divider network 305, and an analog-to-digital converter 310 coupled to the voltage divider network 305. In other embodiments, the controller 200 includes an analog-to-digital converter and the voltage sensor 302 includes the voltage divider network 305 that couples directly to the analog-to-digital converter of the controller 200. The voltage divider network 305 is connected to the voltage supply line, which in the illustrated embodiment includes the positive battery terminal (B+) and the negative battery terminal (B−). In the illustrated embodiment, the voltage divider network 305 includes a first resistor 345 and a second resistor 350. The voltage divider network 305 partitions the supply voltage from the battery pack 120 to output a first voltage ($V_o$) that is proportional to the supply voltage. In some embodiments, the voltage divider network 305 may include more than two resistors 345, 350 and may output more than one voltage $V_o$ that is proportional to the supply voltage.

The analog-to-digital converter 310 connects to the voltage divider network 305 between the first resistor 345 and the second resistor 350 to receive the first voltage $V_o$ proportional to the supply voltage as an input to the analogto-digital converter 310. The analog-to-digital converter 310 converts the analog first voltage $V_o$ proportional to the supply voltage to a digital signal representative of the supply voltage. The analog-to-digital converter 310 may include a number of comparators, a counter, and/or memory registers to convert the analog first voltage $V_o$ from the voltage divider network 305 to a digital signal representative of the supply voltage. In some embodiments, the controller 200 includes the analog-to-digital converter 310, and the analog-to-digital converter 310 is not a separate component.

In the illustrated embodiment, the analog-to-digital converter 310 is also connected to the controller 200. The controller 200 receives the digital signal representative of the supply voltage from the analog-to-digital converter 310, and implements a software control loop. The software control loop first determines the supply voltage from the battery pack 120 based on the digital signal representative of the supply voltage. Then, the software control loop determines if the digital signal representative of the supply voltage meets the first condition, and controls the bipolar transistor 320 accordingly to maintain the supply voltage within the specified range (e.g., above the low voltage threshold and below the high voltage threshold). In the illustrated embodiment, the controller 200 selectively sends control signals to change the state of the bipolar transistor 320 depending on whether the digital signal from the analog-to-digital converter 310 exceeds a predetermined regulating threshold. If the digital signal representative of the supply voltage exceeds the predetermined regulating threshold, the controller 200 sends a control signal to the bipolar transistor 320 to place the bipolar transistor 320 in the conducting state and energy is dissipated through the shunt resistor 315. If the digital signal representative of the supply voltage does not exceed the predetermined regulating threshold, the controller 200 sends a control signal to the bipolar transistor 320 to place the bipolar transistor 320 in the non-conducting state and energy is not dissipated through the shunt resistor 315. The controller 200 may repeat the software control loop a determined number of times per second (e.g., once per millisecond), depending on the components used and the particular application of the voltage regulating circuit 300. Although the software control loop implemented by the controller 200 may be generally slower than some more expensive, hardware-based solutions, since the supply voltage for the hammer drill 100, and many other power tools, changes relatively slowly (e.g., 120 mV/ms), the software control loop still monitors and responds appropriately to maintain the supply voltage within the specified range.

In some embodiments, the control signal from the controller 200 to the bipolar transistor 320 include a logic signal. In such embodiments, the logic signal holds the bipolar transistor 320 in one of the conducting state and the non-conducting state. For example, once the supply voltage exceeds the predetermined regulating threshold, the bipolar transistor 320 is held in the conducting state until the shunt resistor 315 dissipates enough power to reduce the supply voltage back to the predetermined regulating threshold. At that point, the controller 200 places the bipolar transistor 320 back in the non-conducting state until the supply voltage once again exceeds the regulating threshold.

In other embodiments, the control signal from the controller 200 to the bipolar transistor 320 includes a pulse-width modulated (PWM) signal. The duty cycle of the PWM signal may be based on the amount in excess that the actual supply voltage is over the predetermined regulating threshold. For instance, if the supply voltage is below the predetermined regulating threshold, the duty cycle may be zero, and the bipolar transistor 320 may be placed in the non-conducting state. If the supply voltage is slightly above the predetermined regulating threshold (e.g., by 0.25 VDC), the PWM signal may have a low duty cycle (e.g., 25%). If the supply voltage is above the predetermined regulating threshold by a larger amount (e.g., by 1.0 VDC or 1.5 VDC), the duty cycle may be larger (e.g., 50% or 75%).

The predetermined regulating threshold is based on the specific power tool 100 and operational parameters for the BLDC motor 110. In the illustrated embodiment, the supply voltage to the BLDC motor 110 is maintained between 21 VDC and 23 VDC. Thus, the predetermined regulating threshold corresponds to a signal representative of approximately 21 VDC, such that when the controller 200 determines that the supply voltage exceeds 21 VDC, the controller 200 places the bipolar transistor 320 in the conducting state and energy is quickly dissipated by the shunt resistor 315 to prevent the voltage supplied to the BLDC motor 110 from reaching 23 VDC. When the controller 200 determines that the supply voltage does not exceed 21 VDC, the controller 200 places the bipolar transistor 320 in the non-conducting state such that the shunt resistor 315 does not dissipate energy from the supply voltage and thereby drain the battery pack 120. Thus, the shunt resistor 315 dissipates energy from the battery pack 120 when the supply voltage exceeds the predetermined regulating threshold, thereby regulating the voltage supplied to the BLDC motor 110 and preventing the battery pack 120 from draining too quickly. Also, since the controller 200 stores the predetermined regulating threshold in memory 215, the predetermined regulating threshold may be easily changed through software changes/updates. The software loop executed by the controller 200 and the voltage regulating circuit 300 may be used in addition to other filter circuits and snubber circuits that are typically used to control or suppress other peak transient voltages on high side drivers from the controller 200 to maximum of, for example, 30 V or another adequate voltage.

In the illustrated embodiment, the controller 200 controls various operations of the hammer drill 100 in addition to controlling the bipolar transistor 320. However, in other embodiments, the controller 200 controls the bipolar transistor 320 and the other components associated with the voltage regulating circuit 300, while another controller (not shown) controls various other operations of the hammer drill 100.

In some embodiments, the voltage divider network 305 may be calibrated during a manufacturing process to set a precise and accurate predetermined regulating threshold for the controller 200. The calibrated voltage divider network 305 allows a more precise and accurate supply voltage regulation than the prior art zener diode circuit. An exemplary tolerance for the regulation circuit may be 0.5% to 1.0%, instead of 5%, which is common for the zener diode implementation. In some instances, the calibration may include assembling the voltage divider network 305, providing a known, accurate voltage input (e.g., the desired regulating threshold voltage), and determining the analog-to-digital converter 310 output for that particular voltage input. The output from the analog-to-digital converter 310 is then stored or programmed in the memory 215 of the controller 200 as the predetermined regulating threshold. Calibrating the voltage divider network 305 as described mitigates the specific component tolerances associated with, for example, the first and second resistor 345, 350 and eliminates the need for further inferences and calculations.

Alternative calibration techniques may also be used. The analog-to-digital converter 310 may also have additional roles in controlling the tool, such as for assisting in the monitoring and controlling of gate drive refresh.

Since the resistance value of the shunt resistor 315 determines, at least in part, the amount of energy that is dissipated when the bipolar transistor 320 is in the conducting state, it is important that the resistance of the shunt resistor 315 is properly selected. If the shunt resistor 315 has too large of a resistance, the shunt resistor 315 will conduct less current and be less effective at drawing off excessive current to keep the supply voltage below the high voltage threshold. If the shunt resistor 315 has too small of a resistance, the shunt resistor 315 may draw too much current and drain the battery pack 120. The resistance value of the shunt resistor 315 is also an important factor in case of a voltage regulating circuit 300 failure, such as an always on or an always off bipolar transistor 320. To mitigate the effects of such a malfunction, the shunt resistor 315 is sized such that it does not conduct so much current or so little current, that it creates further electrical issues. For instance, the shunt resistor 315 is sized such that, if the bipolar transistor 320 fails, the shunt resistor 315 will not draw too much current and damage any power supply resistors and/or quickly drain the battery pack 120.

The on/off time of the shunt bipolar transistor 320 is also considered when determining the resistance value of the shunt resistor 315. Having an on/off ratio of the shunt bipolar transistor 320 that is too high (e.g., 90%), which typically occurs when the shunt resistor 315 has a high resistance value, or having an on/off ratio of the shunt bipolar transistor 320 that is too low (e.g., 10%), which typically occurs when the shunt resistor 315 has a low resistance value, during normal operation can each pose issues. If the shunt bipolar transistor 320 operates at a high on/off ratio, the voltage regulating circuit 300 may not be able to properly control large voltage spikes during a typical operation of the hammer drill 100. If the shunt bipolar transistor 320 operates at a low on/off ratio, the shunt resistor 315 may drain the battery pack 120 too quickly if the bipolar transistor 320 fails and always remains in the conducting state. Therefore, it is important to select a resistance value for the shunt resistor 315 such that the bipolar transistor 320 operates at an on/off ratio that is neither too high nor too low.

Figure 5:
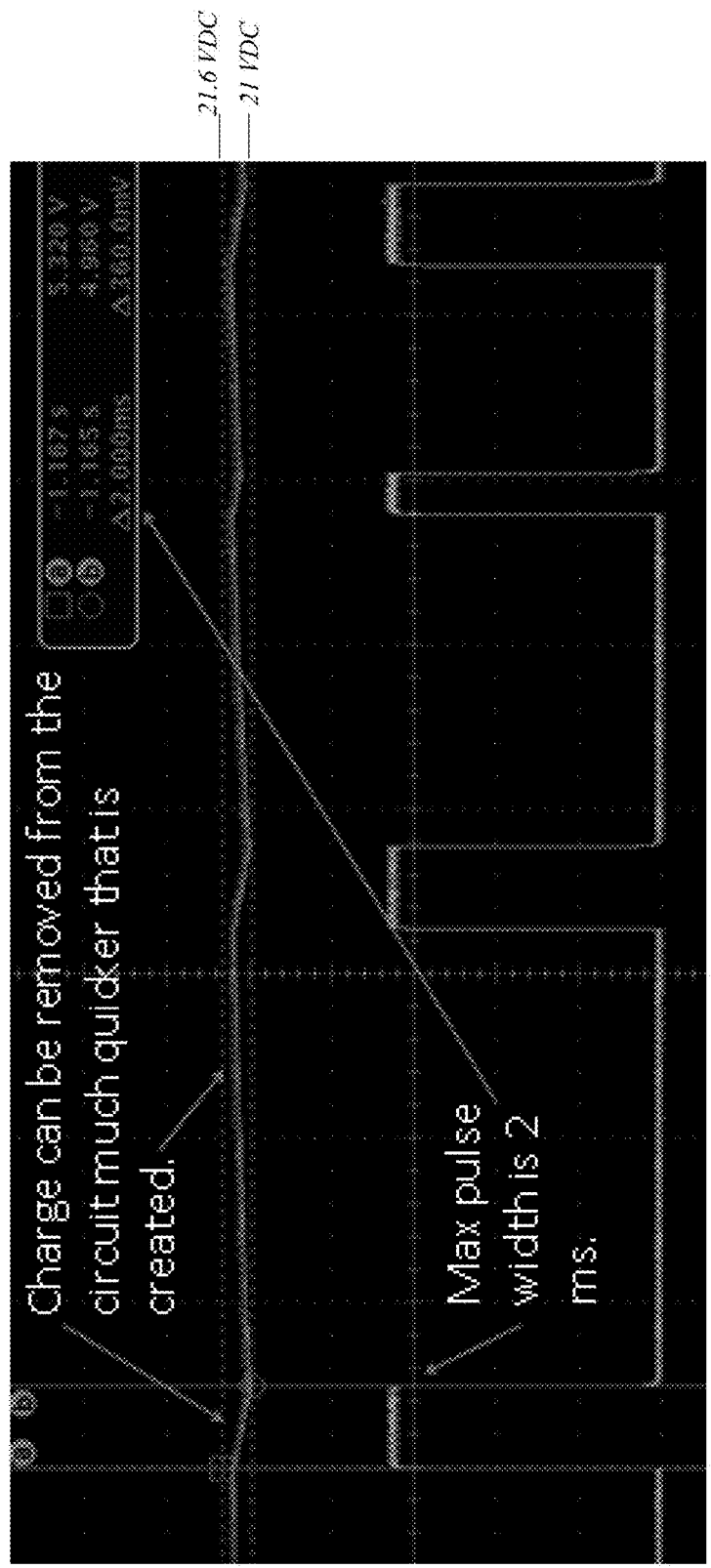
FIG. 5 shows a graph of voltage over time for the voltage regulating circuit of FIG. 4.

FIG. 5 illustrates a voltage vs. time graph of the supply voltage of the hammer drill 100. The top signal shows the voltage supplied to the BLDC motor 110, while the bottom signal shows the control signal from the controller 200 to the bipolar transistor 320. For the illustrated embodiment, the range for the supply voltage includes 21 VDC as the low voltage threshold and 23 VDC as the high voltage threshold. The x-axis represents time in milliseconds, while the y-axis represents voltage in Volts. As shown in FIG. 5, the bipolar transistor 320 receives a logic high signal from the controller 200 to place the bipolar transistor 320 in the conducting state when the supply voltage is determined to exceed 21 VDC. The bipolar transistor 320 receives a logic low signal from the controller 200, which places the bipolar transistor 320 in the non-conducting state, when the supply voltage is measured to be below 21 VDC. As shown in FIG. 5, while the bipolar transistor 320 is in the conducting state (equivalent to the duration of the logic high control signal from the controller 200), the voltage supplied to the motor 110 decreases rapidly (as shown by the downward slope of the supply voltage in FIG. 5). The downward slope of the supply voltage shown in FIG. 5 is due to the shunt resistor 315 dissipating a portion of the energy from the battery pack 120 when the bipolar transistor 320 is in the conducting state. In fact, the shunt resistor 315 decreases the supply voltage approximately four times faster than the battery pack 120 supplies the voltage, as evidenced by the greater (decreasing) slope while the bipolar transistor 320 is in the conducting state and the smaller (increasing) slope while the bipolar transistor 320 is in the non-conducting state. Thus, the controller 200 can control the voltage regulating circuit 300 via the software control loop and allow the bipolar transistor 320 to operate at appropriate on/off ratios to prevent problems caused by too high on/off ratios and too low on/off ratios as described earlier.

As also illustrated in FIG. 5, the voltage regulating circuit 300 discussed herein and illustrated in FIGS. 4-5, actually maintains the supply voltage between 21 VDC and 21.6 VDC. Thus, an extra 1.4V of margin is created as compared with the prior art diode circuit, which regulates the supply voltage between 21 VDC and 23 VDC, as shown in FIG. 3B.

The voltage regulating circuit 300 is configured to maintain the supply voltage to the BLDC motor 110 under the high voltage threshold during high power transient times, such as during low speeds of the hammer drill 100 into stall conditions. In other words, embodiments of the invention handle the slow voltage supply front side issues, which generally occur at lower speeds of the hammer drill 100 as the BLDC motor 110 approaches stall conditions.

Figure 6:
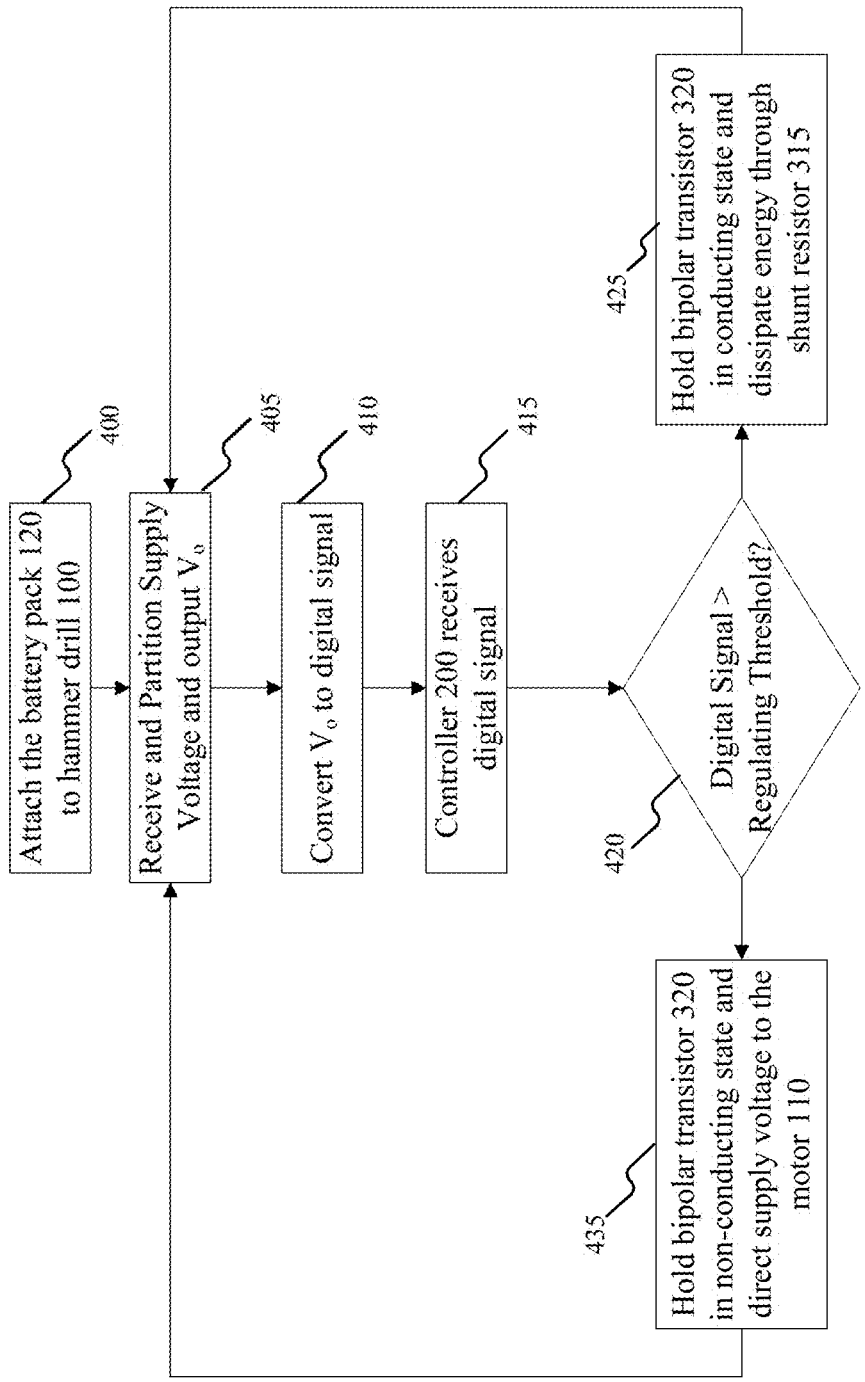
FIG. 6 illustrates a flow chart showing the general operation of the voltage regulating circuit of FIG. 4.

FIG. 6 illustrates the general operation of the voltage regulating circuit 300. First, the battery pack 120 is inserted in the battery pack receiving portion 115 of the hammer drill 100 (block 400). Then, the voltage divider network 305 receives and partitions the supply voltage from the battery pack 120 to output the first voltage $V_o$ that is proportional to the supply voltage (block 405). The analog-to-digital converter 310 then converts the first voltage $V_o$ to a digital signal representative of the supply voltage (block 410). The controller 200 receives the digital signal from the analog-to-digital converter 310 (block 415). The controller 200 then compares the digital signal to the predetermined regulating threshold (block 420). If the digital signal exceeds the predetermined regulating threshold, the controller 200 sends a control signal to the bipolar transistor 320 to place the bipolar transistor 320 in the conducting state (block 425). While the bipolar transistor is in the conducting state, the shunt resistor 315 dissipates excess energy from the battery pack 120 (block 425). If the digital signal does not exceed the predetermined regulating threshold, the controller 200 sends a control signal (or ceases to send a positive control signal) to the bipolar transistor 320 to place the bipolar transistor 320 in the non-conducting state (block 435). While the bipolar transistor 320 is in the non-conducting state, the shunt resistor 315 does not dissipate energy from the battery pack 120 and the motor 110 receives the supply voltage from the battery pack 120 (block 435).

When the supply voltage is pumped up through protection diodes, a goal is to reduce the supply voltage to prevent damage to the voltage regulators. However, this issue is not a typical condition requiring a continuous voltage regulator or shunt. In other words, the voltage regulating circuit 300 provides adequate protection, in part, because the high voltage transients and voltage pumping behavior happens when the tool is running at high current modulation (PWM) and approaching stall conditions. That separation of time and running conditions allows this simpler regulating circuit, which does not need to have continuous high ratings or tight accuracy, to work appropriately.

Thus, the invention provides, among other things, an apparatus with active software clamping of the supply voltage.

What is claimed is:

1. A power tool comprising:
   a motor configured to drive a working element;
   a power supply coupled to the motor to provide power to the motor;
   a shunt circuit coupled to the power supply and the motor, the shunt circuit configured to hold a voltage of the power supply below a high voltage threshold, the shunt circuit including a shunt element and a shunt switch, the shunt switch switchable between
      a conducting state, in which the shunt switch enables the shunt element to conduct current, and
      a non-conducting state, in which the shunt switch prevents the shunt element from conducting current;
   a controller coupled to the motor, the power supply, and the shunt circuit, the controller configured to
   determine the voltage of the power supply, and
   control the shunt switch based on the voltage from the power supply by holding the shunt switch in the conducting state when the voltage of the power supply is above the high voltage threshold, and holding the shunt switch in the non-conducting state when the voltage of the power supply is not above the high voltage threshold.

2. The power tool of claim 1, wherein the controller is also configured to control the motor.

3. The power tool of claim 1, wherein the shunt circuit is connected in parallel to the motor.

4. The power tool of claim 1, wherein the power tool further comprises a voltage divider network coupled to the controller, and wherein the controller is configured to determine the voltage of the power supply based on information from the voltage divider network.

5. The power tool of claim 4, wherein the controller being configured to determine the voltage of the power supply includes the controller being configured to
   receive a digital signal from an analog-to-digital converter, the digital signal representative of the voltage from the power supply and based on information from the voltage divider network,
   compare the digital signal to a regulating threshold, and output a control signal to the shunt switch; and
   wherein, if the digital signal from the analog-to-digital converter exceeds the regulating threshold, the control signal places the shunt switch in the conducting state, and if the digital signal from the analog-to-digital converter does not exceed the regulating threshold, the control signal places the shunt switch in the non-conducting state.

6. The power tool of claim 1, wherein the controller is configured to output one of the group consisting of a logic signal and a pulse-width modulated signal to control the shunt switch.

7. A method of regulating a supply voltage of a power tool, the method comprising:
   determining, by a controller, whether the supply voltage of the power tool exceeds a regulating threshold; and
   regulating, by a shunt switch and a shunt element, the supply voltage to prevent the supply voltage from exceeding a high voltage threshold;
   wherein regulating the supply voltage includes:
      placing, by the controller, a shunt switch in a conducting state in response to the determination that the supply voltage of the power tool exceeds the regulating threshold;
      dissipating energy, by a shunt element, when the shunt switch is in the conducting state thereby preventing the supply voltage from exceeding the high voltage threshold;
      placing, by the controller, the shunt switch in a non-conducting state in response to the determination that the supply voltage does not exceed the regulating threshold; and
      disconnecting, by the shunt switch, the shunt element thereby preventing the shunt element from conducting current from the supply voltage.

8. The method of claim 7, further comprising
   partitioning the supply voltage to output a first voltage proportional to the supply voltage, and
   converting, by an analog-to-digital converter, the first voltage proportional to the supply voltage to a digital signal representative of the supply voltage.

9. The method of claim 8, wherein determining, by the controller, whether the supply voltage exceeds a regulating threshold includes comparing the digital signal representative of the supply voltage to the regulating threshold.

10. The method of claim 7, further comprising executing, by the controller, a software control loop to repeatedly determine whether the supply voltage exceeds the regulating threshold and control the shunt switch to regulate the supply voltage.

11. The method of claim 7, wherein regulating, by the shunt switch and the shunt element, the supply voltage occurs while a motor receives power from the supply voltage.

12. A power tool comprising:
   a motor configured to drive a working element;
   a power supply coupled to the motor to provide power to the motor;
   a shunt circuit coupled to the power supply and the motor, the shunt circuit coupled in parallel to the motor, the shunt circuit including a shunt switch and a shunt resistor, the shunt switch including a control terminal and a conducting terminal, and the shunt resistor being connected to the conducting terminal of the shunt switch and configured to conduct current via the conducting terminal;
   a voltage sensor coupled to the power supply and connected in parallel to the motor and the shunt circuit;
   a controller coupled to the voltage sensor and to the shunt circuit, the controller configured to
      receive a signal from the voltage sensor representative of a supply voltage from the power supply,
      determine if the supply voltage exceeds a regulating threshold,
      output a control signal to the shunt circuit based on whether the signal representative of the supply voltage exceeds the regulating threshold.

13. The power tool of claim 12, wherein the shunt switch is switchable between
   a conducting state, in which the shunt circuit conducts current and
   a non-conducting state, in which the shunt circuit does not conduct current.

14. The power tool of claim 12, wherein the controller is configured to output a control signal to the shunt switch to place the shunt switch in a conducting state when the supply voltage exceeds the regulating threshold; and output a control signal to the shunt switch to place the shunt switch in a non-conducting state when the supply voltage does not exceed the regulating threshold.

15. The power tool of claim 12, wherein the controller is also coupled to the motor, and the controller is configured to output a motor control signal to the motor to control an operation of the motor when the motor receives power from the power supply.

16. The power tool of claim 15, wherein when the motor does not receive power from the power supply, the controller does not output the control signal to the shunt circuit.

17. The power tool of claim 15, wherein the control signal to the shunt circuit is one of the group consisting of a logic signal and a pulse-width modulated signal.

18. The power tool of claim 12, wherein the shunt circuit dissipates energy from the power supply such that the power supply does not exceed a high voltage threshold.

19. The power tool of claim 12, wherein the voltage sensor includes a voltage divider network that is coupled to an analog-to-digital converter;

wherein the analog-to-digital converter is configured to convert an analog signal representative of the supply voltage from the voltage divider network to a digital signal representative of the supply voltage; and wherein the controller determines if the supply voltage exceeds the regulating threshold based on the digital signal representative of the supply voltage.

20. The power tool of claim 12, wherein the shunt circuit is switchable between a disabled state and an enabled state, wherein the controller is further configured to activate the motor to drive the working element, and wherein, while the motor is activated, the control signal to the shunt circuit alternates the shunt circuit between the enabled state and the disabled state.

* * * * *

UNITED STATES PATENT AND TRADEMARK OFFICE
CERTIFICATE OF CORRECTION

PATENT NO. : 9,623,545 B2
APPLICATION NO. : 14/176812
DATED : April 18, 2017
INVENTOR(S) : Mergener et al.

Page 1 of 1

It is certified that error appears in the above-identified patent and that said Letters Patent is hereby corrected as shown below:

On the Title Page

Item (12) "Mergener" should read -- Mergener, et al. --.

Item (72) Inventor is corrected to read:
-- Matthew J. Mergener, Mequon (WI);
Daniel R. Ertl, Brookfield (WI);
Jay J. Rosenbecker, Menomonee Falls (WI) --.

Signed and Sealed this
Twenty-fourth Day of September, 2019

Andrei Iancu
*Director of the United States Patent and Trademark Office*